(12) United States Patent
Hassani et al.

(10) Patent No.: US 7,190,581 B1
(45) Date of Patent: Mar. 13, 2007

(54) LOW THERMAL RESISTANCE POWER MODULE ASSEMBLY

(75) Inventors: Vahab Hassani, Denver, CO (US);
Andreas Vlahinos, Castle Rock, CO (US); Desikan Bharathan, Arvada, CO (US)

(73) Assignee: Midwest Research Institute, Kansas City, MO (US)

( * ) Notice: Subject to any disclaimer, the term of this patent is extended or adjusted under 35 U.S.C. 154(b) by 86 days.

(21) Appl. No.: 11/032,771

(22) Filed: Jan. 11, 2005

(51) Int. Cl.
*H05K 7/20* (2006.01)

(52) U.S. Cl. .................... 361/699; 361/688; 361/698; 165/80.3; 165/80.4; 62/259.2

(58) Field of Classification Search ............... 361/689, 361/698–699, 701–704, 707, 710, 714, 715, 361/717–722; 165/80.3, 80.4; 257/713–714, 257/723, 731, 789, 678, 796; 62/259.2; 174/16.3, 174/252; 29/521, 557, 505, 840, 890.03, 29/841

See application file for complete search history.

(56) References Cited

U.S. PATENT DOCUMENTS

| | | | | |
|---|---|---|---|---|
| 2,942,165 | A * | 6/1960 | Jackson et al. | 257/714 |
| 3,004,196 | A * | 10/1961 | Drexel | 257/717 |
| 5,086,324 | A | 2/1992 | Hagino | |
| 5,262,921 | A * | 11/1993 | Lamers | 361/699 |
| 5,453,911 | A * | 9/1995 | Wolgemuth et al. | 361/689 |
| 5,966,291 | A * | 10/1999 | Baumel et al. | 361/707 |
| 6,141,219 | A * | 10/2000 | Downing et al. | 361/704 |
| 6,400,012 | B1 * | 6/2002 | Miller et al. | 257/712 |
| 6,448,587 | B1 | 9/2002 | Kohno et al. | |
| 6,473,303 | B2 * | 10/2002 | Kaufmann | 361/699 |
| 6,580,108 | B1 | 6/2003 | Utsumi et al. | |

(Continued)

FOREIGN PATENT DOCUMENTS

| | | | |
|---|---|---|---|
| JP | 409121577 A | * | 5/1997 |
| JP | 411163572 A | * | 6/1999 |
| JP | 2001168256 A | * | 6/2001 |

OTHER PUBLICATIONS

Schulz-Harder, J. et al., "Micro Channel Water Cooled Power Modules" Curamilk Electronics (2000).
Tyko Flex "Liquid Cooled Platefor Railway IGBT Converters" http://www.tykoflex.se (latest website update 2004).

*Primary Examiner*—Michael Datskovskiy
(74) *Attorney, Agent, or Firm*—Paul J. White

(57) ABSTRACT

A power module assembly with low thermal resistance and enhanced heat dissipation to a cooling medium. The assembly includes a heat sink or spreader plate with passageways or openings for coolant that extend through the plate from a lower surface to an upper surface. A circuit substrate is provided and positioned on the spreader plate to cover the coolant passageways. The circuit substrate includes a bonding layer configured to extend about the periphery of each of the coolant passageways and is made up of a substantially nonporous material. The bonding layer may be solder material which bonds to the upper surface of the plate to provide a continuous seal around the upper edge of each opening in the plate. The assembly includes power modules mounted on the circuit substrate on a surface opposite the bonding layer. The power modules are positioned over or proximal to the coolant passageways.

20 Claims, 11 Drawing Sheets

U.S. PATENT DOCUMENTS

| | | |
|---|---|---|
| 6,738,253 B2 * | 5/2004 | Beuille et al. .............. 361/679 |
| 6,738,258 B2 | 5/2004 | Bijlenga et al. |
| 6,798,025 B2 | 9/2004 | Matsuda |
| 6,822,865 B2 | 11/2004 | Balszunat et al. |
| 6,960,278 B2 * | 11/2005 | Petitbon et al. .......... 156/272.8 |
| 6,977,346 B2 * | 12/2005 | Jairazbhoy et al. ......... 174/252 |
| 6,992,887 B2 * | 1/2006 | Jairazbhoy et al. ......... 361/689 |
| 2006/0108098 A1 * | 5/2006 | Stevanovic et al. ........ 165/80.4 |

* cited by examiner

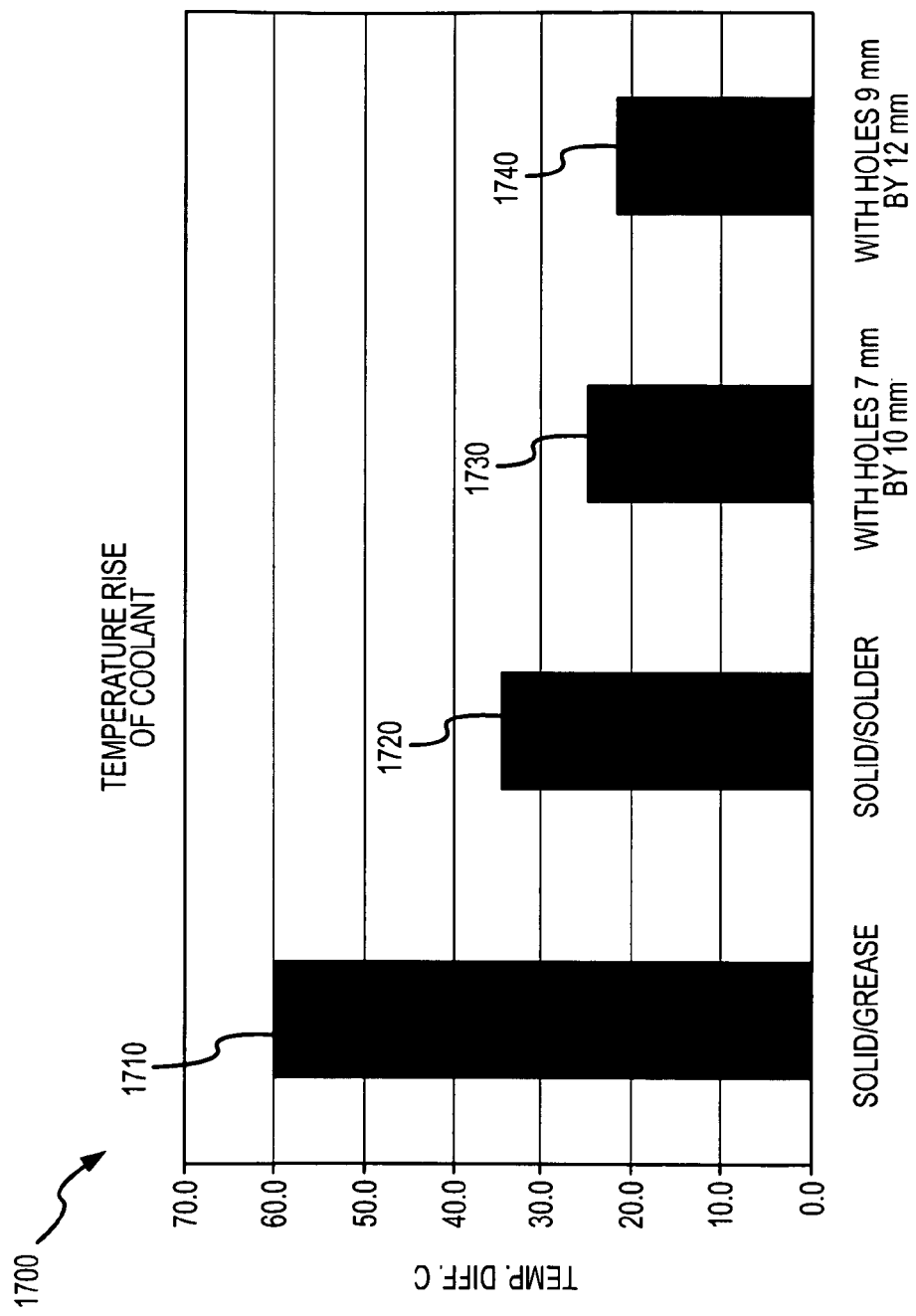

LOW THERMAL RESISTANCE POWER MODULE ASSEMBLY

CONTRACTUAL ORIGIN OF THE INVENTION

The United States Government has rights in this invention under Contract No. DE-AC36-99GO10337 between the United States Department of Energy and the National Renewable Energy Laboratory, a Division of the Midwest Research Institute.

BACKGROUND OF THE INVENTION

1. Field of the Invention

The present invention relates, in general, to cooling electric circuitry and to controlling the operating temperatures of electric modules such as power modules, and, more particularly, to power module assemblies configured to have low thermal resistances including a reduced number and thickness of thermal resistant or insulator layers, such as those in a semiconductor substrate, between a power module (or other electric component or element that generates heat) and a coolant and/or a heat sink.

2. Relevant Background

There continues to be a growing demand for power semiconductor or integrated circuit (IC) modules and other electric elements with higher power density, higher reliability, and improved cost effectiveness. Miniature power and electric modules are used extensively in a range of applications including automobiles, hard drives, data storage devices, and nearly any electronic product. These power and electric modules often operate at high voltage and current which causes them to generate a large amount of heat which causes the modules to become hot. For proper operation, the power and electric modules or elements need to be maintained below predefined operating temperatures to avoid performance degradation or failure, such as 125° C. for many power modules but the desired operating temperature may vary with the particular application. However, the goals of miniaturization and increased performance run are in conflict with effective thermal management because higher power demands result in greater heat generation while increased module density reduces the size of cooling surfaces. As a result, cooling problems plague all electronic systems and are particularly troubling in electronic systems utilizing IC power modules, such as Insulated-Gate Bipolar Transistors (IGBTs), power metal-oxide-semiconductor field-effect transistors (MOSFETs), and the like.

Electronic component designers have a number of options for attempting to dissipate or remove heat generated by an electronic circuit, such as power module, but none have adequately met the demands for higher performance with reduced size. Designers may use convection to remove heat by transferring heat away from the electric components with air flow. This is useful for small portable devices such as cell phones but is not as effective for power modules that are tightly spaced in enclosed spaces such as are present in automobiles and other products. In these cases, convection is supplemented or replaced by conduction in which heat is wicked or transferred away from the hot or higher temperature electronic circuit or power module to cool or lower temperature of components that contact or abut the electronic circuit or the substrate upon which the circuit is mounted. Typically, a coolant may be used to remove heat from the lower temperature components, e.g., water or another fluid may be pumped over a portion of components contacting the base of the electronic circuit to maintain a lower temperature. In such conductive designs, increased heat transfer has typically been obtained by increasing the rate at which heat is transferred from the electronic circuit, as measured by the heat transfer coefficient of the electronic circuit or power module assembly. Unfortunately, such techniques of increasing the heat transfer coefficient have not been able to keep pace with the demand for increase module density and have caused many modules to be designed to operate at levels below performance capacity, e.g., at reduced power levels.

A specific example of an electronic system that must be designed for operating within an acceptable temperature range and therefore, for heat dissipation, is an IC power module assembly such as an IGBT device. FIGS. 1–3 illustrate a conventional design for a power module assembly 100. As shown, the power module assembly 100 includes a heat sink 110 made up of a spreader plate 112 and a number of channel walls (or heat transfer fins) 114. A cooling medium or coolant, such as water, is pumped through the walls 114 contacting the walls 114 and spreader plate 112 and removes heat from the heat sink 110 as the inlet coolant, $C_{IN}$, is at a lower temperature than the outlet coolant, $C_{OUT}$. The assembly 100 also includes a circuit substrate 120 that is mounted on the spreader plate 112 of the heat sink 110 and a power or circuit module 130 that is mounted on the circuit substrate 120. The power module 130 is shown in FIG. 3 to include a circuit layer, e.g., a silicon die with an IGBT, power MOSFET, or the like, 136 and a connection or joint layer 132, such as solder or other joining materials, for joining or mounting the circuit layer to the circuit substrate 120. Heat that is generated in the power module 130 is conducted through the circuit substrate 120 and heat sink 110 to the flowing coolant.

The thermal resistance of the power module assembly 100 depends mainly on the thermal resistance of the spreader plate 112 and circuit substrate 120. The circuit substrate 120 may take a number of forms, but in the case of an IGBT power module assembly 100, often take the form of a Direct Bonded Copper (DBC) substrate that is thermally bonded to the heat sink 110. In this example, as shown in FIG. 3, the circuit substrate 120 is thermally bonded to the spreader plate 112 with a thermal bonding layer 122 that typically would be thermal grease or paste. The circuit substrate 120 includes a ceramic isolation layer 126, such as layer of AlN or other ceramic material, sandwiched between two conductive layers, such as layers of copper or the like, 124, 128. As can be appreciated, maintaining the temperature of the power module 130 requires heat to be conducted through the bonding layer 132 of the power module 130, through the circuit substrate 120 including the thermal bonding layer 122, and through the spreader plate 112.

Attempts to improve the heat exchange characteristics of power module assemblies, such as assembly 100, have not been entirely effective requiring power (and corresponding heat) produced by the power module to be limited. Most conventional techniques have concentrated on increasing the heat transfer rate or coefficient on the fluid side on surface 114, such as by employing micro channels, by using extensions from the spreader plate (such as the channel walls or fins 114 in heat sink 110 of FIGS. 1 and 2), or by using other techniques to improve heat transfer effectiveness of the power module assembly.

Hence, there remains a need for improved designs for dissipating heat generated by electronic circuits, such as power modules. Preferably, such improved designs would be compatible with existing module designs and manufacturing techniques and would significantly reduce the thermal resistance between the component generating the heat and the heat sink and/or coolant.

SUMMARY OF THE INVENTION

The present invention addresses the above problems by providing an electronic component assembly that is configured for low thermal resistance (e.g., reduced by more than 50 percent or more compared to convention devices) between a coolant or cooling medium and an electronic component or power module, such as a surface mounted device (SMD), an IGBT substrate, a MOSFET, an IC or printed circuit board or layer, or the like. The assembly generally achieves this reduction by providing a heat sink or spreader plate that includes a coolant passageway or opening for each module that is to be mounted on the heat sink or plate. The passageway or opening extends through the thickness of the heat sink or plate such that coolant can flow through the passageway or opening to more directly dissipate heat. A circuit substrate, such as a DBC substrate, is mounted to the plate with bonding material, such as solder or other nonporous material, providing a seal against flow of the coolant between the substrate and the plate. In this manner, coolant is able to directly contact the bottom layer of the circuit substrate rather than only contacting the plate, which required heat to be conducted through the plate and any bonding layer (such as thermal grease). The electronic component or power module is then mounted or bonded to the circuit substrate so as to be positioned generally opposite (or over) the passageway or opening, thereby providing a relatively direct path between the heat-generating module and portions of the circuit substrate contacting the coolant flowing in the passageway or plate opening. In this manner, thermal resistance can be reduced 50 percent or more when compared with more conventional, solid spreader plate designs.

More particularly, a power module assembly is provided with lower thermal resistance to enhance heat dissipation to a coolant. The assembly includes a heat sink plate with a lower surface and an upper surface. Significantly, the plate also includes a number of passageways for coolant that extend from the lower surface to the upper surface of the plate. A circuit substrate is included in the assembly and positioned on the heat sink plate so as to cover the coolant passageways. The circuit substrate includes a bonding layer that is configured to extend about the periphery of each of the coolant passageways and is made up of a substantially nonporous material. In one embodiment, the bonding layer is solder or a similar material which bonds to the upper surface of the plate to provide a continuous seal around the upper edge of each opening or passageway in the plate. The assembly also includes a set of power modules, such as IGBT modules, that are mounted on the circuit substrate on a surface opposite the bonding layer. Each of the power modules is preferably positioned on the substrate to be over or proximal to one of the coolant passageways. The passageways may have a variety of cross sectional shapes but in one embodiment, the passageways are circular in cross section and may be tapered with a smaller diameter at the upper surface of the plate than at the lower surface.

According to another aspect of the invention, a method is provided for manufacturing power module assemblies having reduced thermal resistance. The method includes providing a power module substrate that has a plurality of power modules distributed in a pattern on a circuit substrate. The circuit substrate is made up of a pair of electrical conductor layers, e.g., copper layers, that sandwich a ceramic isolation layer (e.g., AlN or similar ceramic). To provide this power module substrate, the method may include providing silicon dies with IGBTs or other power circuits and a DBC substrate and then bonding (e.g., soldering) the modules to the substrate with the silicon dies arranged in the module pattern. The method also includes providing a plate made or other material that can be bonded to the circuit substrate. Then, based on the power module pattern, a hole is punched, cut, or otherwise formed or made through the thickness of the plate for each of the power modules. The method continues with applying a bonding material to an upper surface of the plate (or the layer can be applied prior to the hole formation step). The bonding material is applied in a continuous manner (i.e., without gaps) about the periphery of each hole in the plate. The plate is then bonded to the power module substrate with the bonding material. For example, if the bonding material is solder material, the bonding material is heated and then later cooled to affect bonding. During the bonding, the holes in the plate are aligned with the power modules to provide a relatively direct heat transfer path from the modules to coolant in the holes. For example, the central axis of the holes may be aligned with the center of each of the power modules. Preferably, in this method, the bonding material is selected to be substantially nonporous to liquids such as the coolant so as to form a liquid-tight seal between the upper surface of the plate and the mating electrical conductor layer.

BRIEF DESCRIPTION OF THE DRAWINGS

FIG. 17 is a bar graph illustrating temperature difference between coolant and IGBT in modeling of conventional power module assemblies and power module assemblies configured according to embodiments of the present invention.

DETAILED DESCRIPTION OF THE PREFERRED EMBODIMENTS

The invention is directed to electronic system design in which electric circuit elements or modules, such as IC power modules or other circuit elements that generate heat during use, are more effectively cooled by significantly reducing thermal resistance between the electric circuit element and a coolant or cooling medium. In exemplary embodiments of electric circuit assemblies of the invention, the electric circuit element or module is typically an IC that is provided in a die such as a silicon die and is mounted, e.g., soldered, to an electric circuit substrate, e.g., a DBC substrate. The electric circuit substrate is in turn mounted upon a heat sink such as a spreader plate and during operation, a cooling medium or coolant is forced to flow adjacent and in contact with the heat sink to remove heat from the electric circuit assembly.

Figure 1:
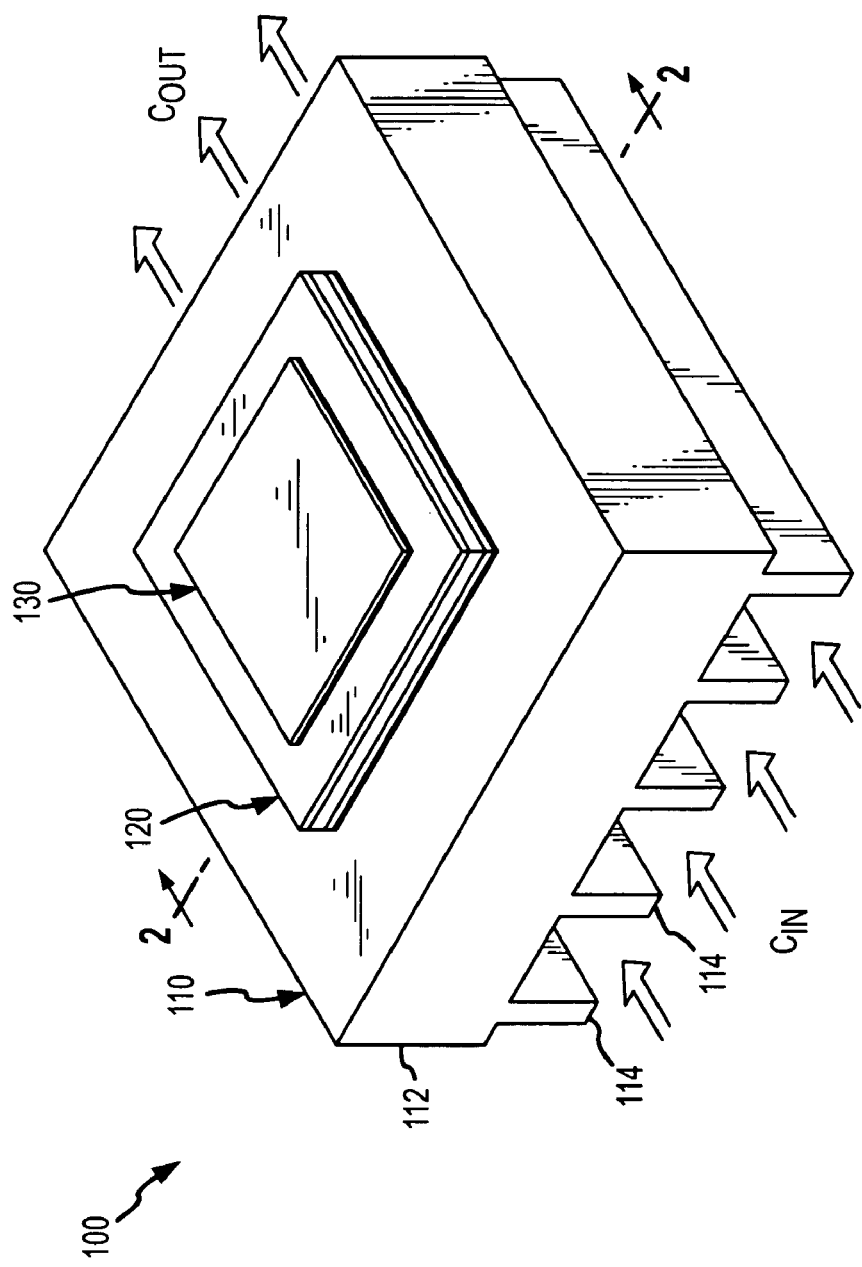
FIG. 1 is a perspective view of a prior art power module assembly utilizing a cooling medium or coolant to conduct heat away from a power module through a circuit substrate and spreader plate.
Figure 2:
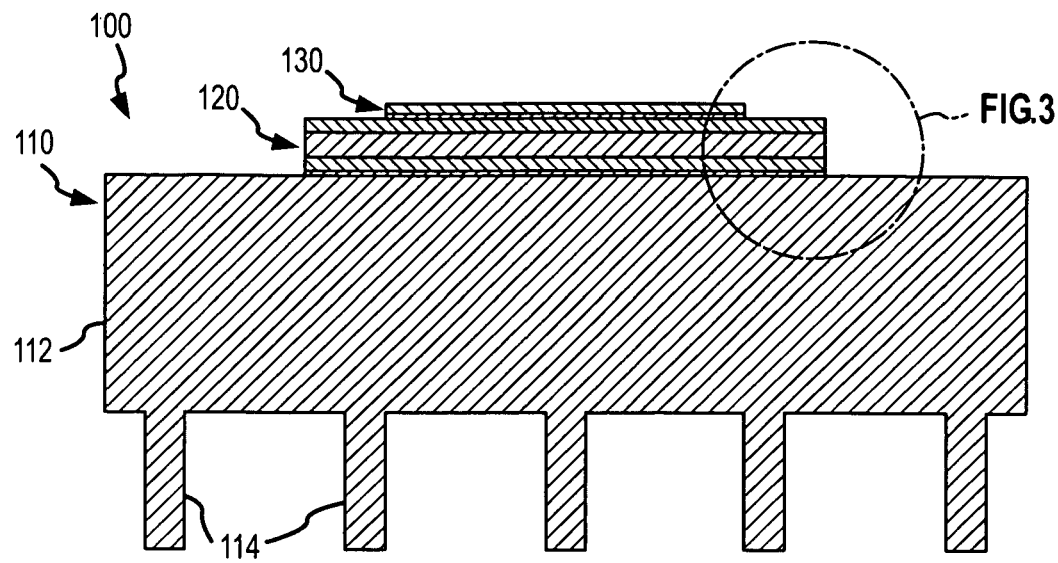
FIG. 2 is a cross sectional view of the power module assembly of FIG. 1 taken at line 2—2.
Figure 3:
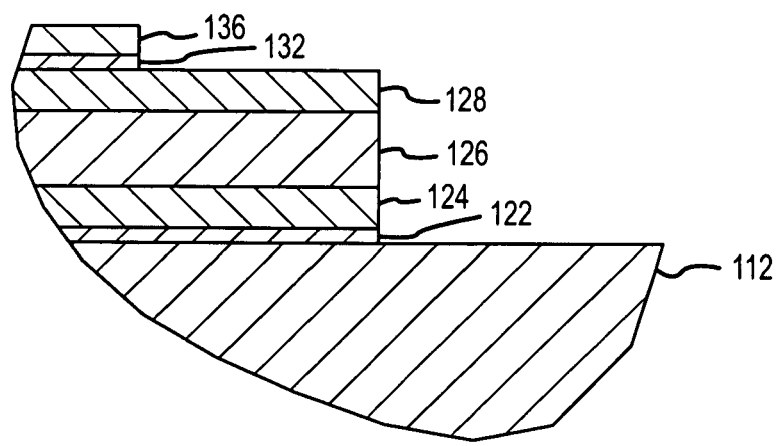
FIG. 3 illustrates in more detail a portion of the power module assembly of FIG. 2 illustrating layers of the power module assembly through which heat must flow to be dissipated from the electric circuit or power element, i.e., the portions of the power module assembly contributing to the thermal resistance of the prior art power module assembly.

According to one feature of the invention, a coolant passageway or heat dissipation opening is provided through (or nearly through) the heat sink to directly expose a surface of the electric circuit substrate to the coolant (such as a surface beneath at least a portion of the electric circuit element). As a result, the thermal resistance of electric circuit assemblies of the invention is significantly reduced when compared with prior assemblies, such as that shown in FIGS. 1–3, because the thermal resistance of the heat sink or spreader plate is removed (or at least significantly reduced) as is the heat resistance due to the thermal grease or paste typically used to mount a DBC substrate to a spreader plate. According to another feature of the invention, coolant is able to directly contact the electric circuit substrate, e.g., a DBC substrate, in part because a water-tight seal is provided between the heat sink or spreader plate and the electric circuit substrate. This is achieved by providing a bonding layer in the electric circuit substrate that not only bonds the substrate to the heat sink but also provides a seal that blocks the coolant from passing. Many non-porous materials and bonding techniques may be used, and in some embodiments of the invention, the bonding and sealing layer of the electric circuit substrate is solder material as the substrate is soldered to the heat sink in a continuous manner about the periphery of the coolant passageway or heat dissipation opening in the heat sink.

In the following discussion, the invention is explained in detail with reference to power module assemblies rather than more general electronic circuit assemblies. This is done for ease of explanation rather than as limiting the invention to power module applications. It will be understood by those skilled in the art that the concepts of the invention can readily be applied to nearly any electronic application in which an electric element such as an IC is generating excessive heat that needs to be effectively dissipated. A specific application of the invention is for providing effective heat dissipation from IGBTs which are used extensively in the electronics industry, but again, IGBTs are just one example of power modules that may be cooled with the features of the present invention. FIGS. 4–14 illustrate the invention with reference to a single power module but, as shown, in FIGS. 15–17, the concepts discussed with reference to the single power modules of FIGS. 4–14 are readily applicable to more conventional configurations or designs with multiple power modules or circuit elements (such as diodes and the like).

Figure 4:
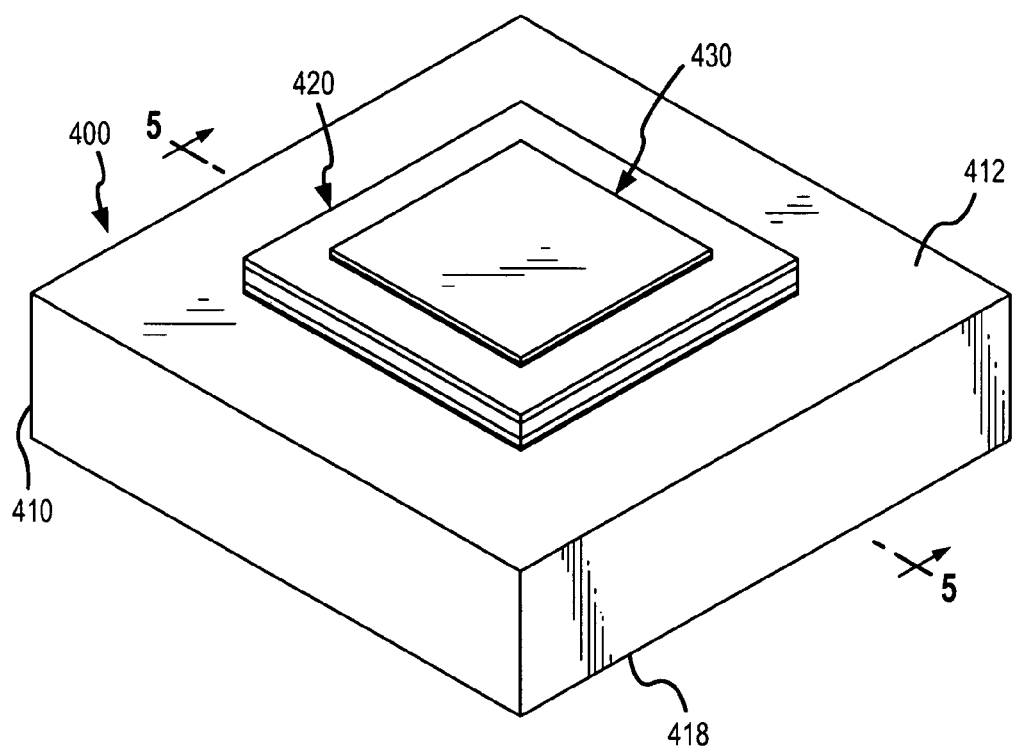
FIG. 4 is a perspective view of a power module assembly configured according to the present invention with low thermal resistance.

FIG. 4 illustrates an exemplary power module assembly 400 of the present invention. The power module assembly 400 includes a heat sink (which is in the following discussion used interchangeably with spreader plate) 410. A circuit substrate 420 is mounted upon an upper surface 412 of the spreader plate 410, and as shown, a power module 430 is mounted upon the circuit substrate 420. The power module assembly 400 would typically be implemented singly or with other assemblies 400 (not shown) which electrical and other connections (not shown) to the power module 430 and/or circuit substrate 420. As with the assembly 100 of FIG. 1, a coolant or cooling medium, such as water or other fluid, would be forced to flow adjacent the lower surface 411 (see FIG. 5) of the spreader plate 410 to dissipate heat generated by operation of the power module 430.

Figure 5:
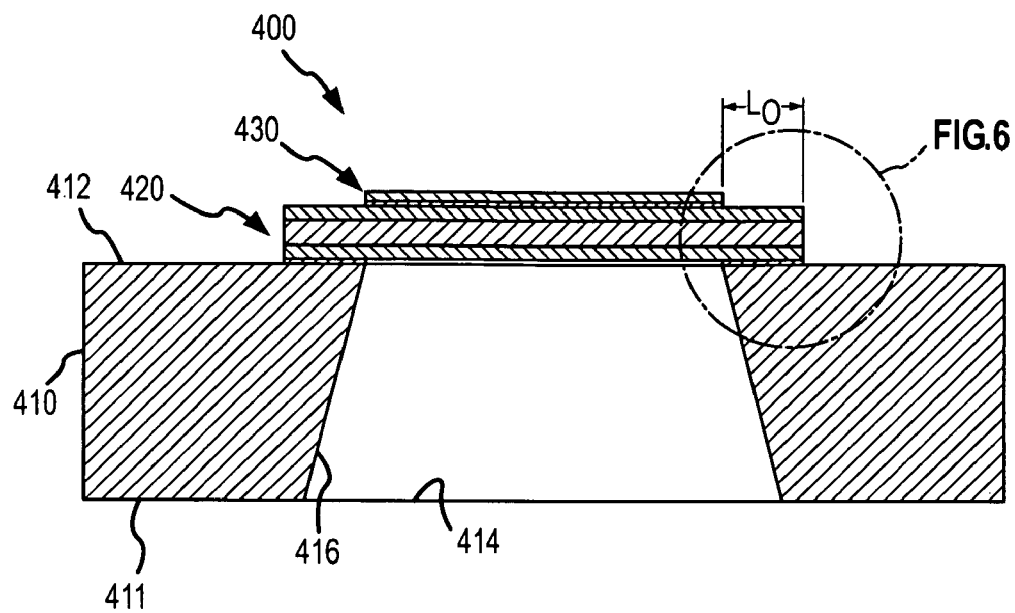
FIG. 5 is a cross section of the power module assembly of FIG. 4 taken at line 5—5 illustrating modification of the spreader plate or heat sink to include an opening allowing coolant to contact the circuit substrate (e.g., DBC substrate)

FIG. 5 illustrates a cross section of the power module assembly 400. As can be appreciated, heat that is generated in the power module 430 is conducted for dissipation through the abutting circuit substrate 420 to the spreader plate 410. As shown, the spreader plate 410 configuration differs from that of conventional spreader plates, such as plate 112 of FIG. 1, as it is configured to direct coolant flow to contact directly the circuit substrate. To this end, the spreader plate 410 includes a coolant passageway or heat dissipation opening 414 that allows coolant (not shown) to flow from the lower surface 411 of the plate 410 to the upper surface 412 of the plate 410 so as to contact the circuit assembly 420. In this manner, at least a portion of the heat generated by the power module 430 is dissipated from the electric substrate 420 directly to the flowing coolant rather than having to pass through the thickness of the spreader plate 410. As shown, the passageway or opening 414 is typically positioned within the power module assembly 400 to be beneath or adjacent the portion of the circuit substrate 420 on which the power module 430 is mounted. In other words, the passageway 414 is positioned such that there is a relatively direct path from the power module 430 through the substrate 420 to the coolant contacting the substrate 420.

The passageway or opening 414 may take many forms, shapes, and sizes to practice the invention. As shown, the opening 414 is generally circular at the lower and upper surfaces 411, 412 and includes a single wall 416 that slopes inward from the lower surface 411 to the upper surface 412 such that the opening 414 has a larger diameter at the lower surface 411 than at the upper surface 412 (e.g., to better control coolant flow and allow smoother return flow from the electric substrate 420). The size of the opening 414 at the upper surface 412 is, of course, selected to be smaller than the abutting or adjacent portion of the electric substrate 420 to provide an overlapping length, $L_O$, of the substrate 420 contacting the upper surface 412 about the periphery of the substrate 420 (this is shown as one dimension but may differ about the periphery in other embodiments). The size of the overlapping portion of the substrate 420 as measured by the length, $L_O$, may be selected to obtain a desired exposure of the substrate 420 to the coolant flowing in the opening 414 and also to provide a desired structural strength (e.g., to avoid cracking due to stresses occurring because of deflection and the like). For example, if the substrate 420 has dimensions of 10 mm by 10 mm adjacent the plate 410, the diameter of the opening 414 at the upper surface 412 may be selected to be about 9 mm or less such that the length, $L_O$, of the overlapping or overhanging portion of the substrate 420 is at least about 0.5 mm. Additionally, in other embodiments, the opening 414 may be more cylindrical with a wall 416 that is generally perpendicular to the substrate 420 and/or may have differing cross sectional shapes such as oval or nearly a multi-sided or polygonal shape.

Figure 6:
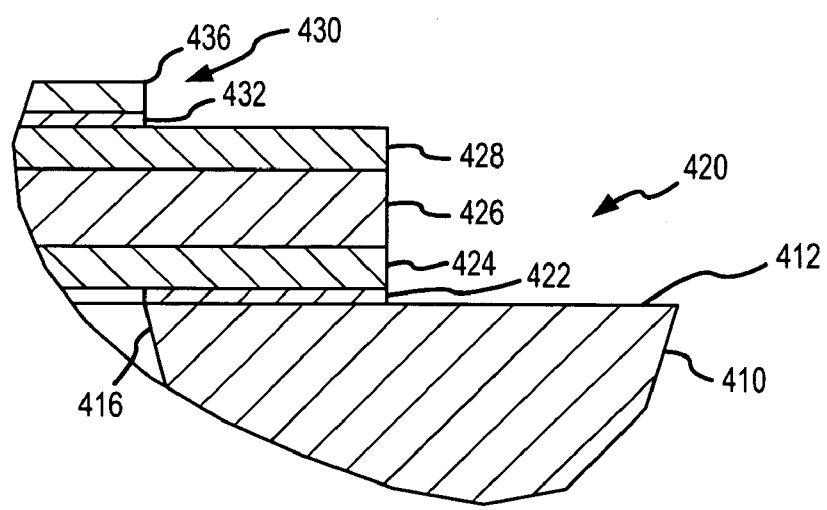
FIG. 6 is a detailed view of a portion of the power module assembly of FIG. 5 showing the layers of the power module assembly and the sealed or water-tight connection of the circuit substrate to the spreader plate.
Figure 7:
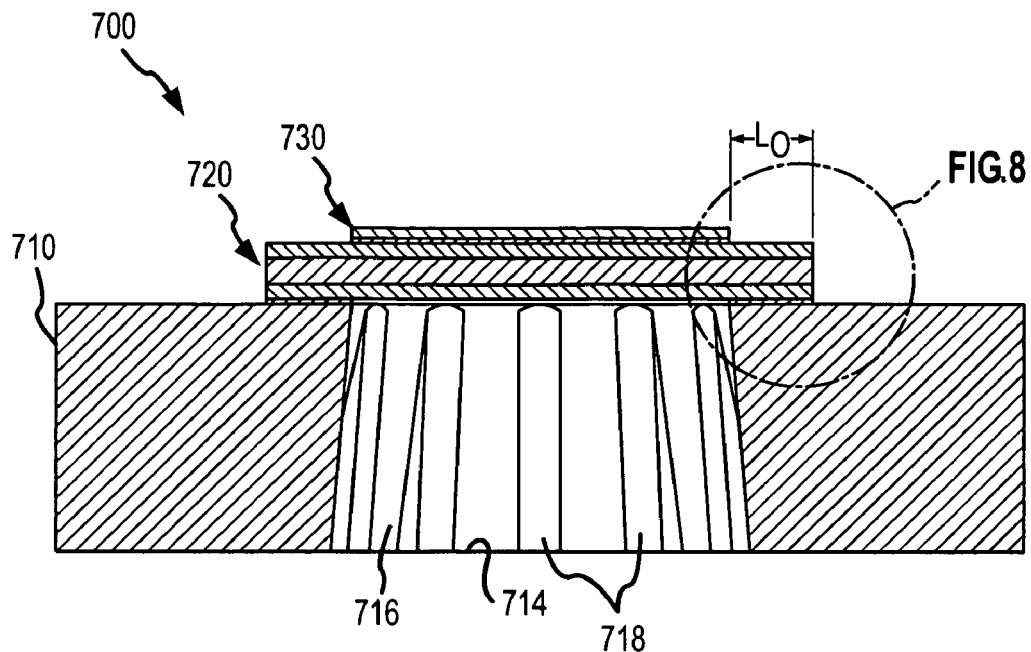
FIG. 7 is a cross sectional view similar to that of FIG. 5 of an alternative embodiment of a power module assembly according to the present invention.
Figure 8:
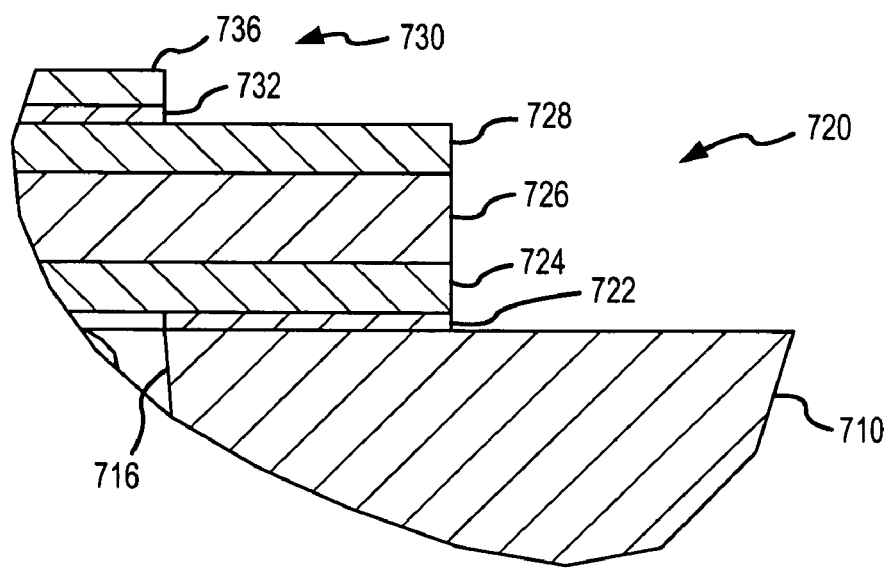
FIG. 8 is a detailed view of a portion of the power module assembly of FIG. 7 similar to that of FIG. 6.
Figure 9:
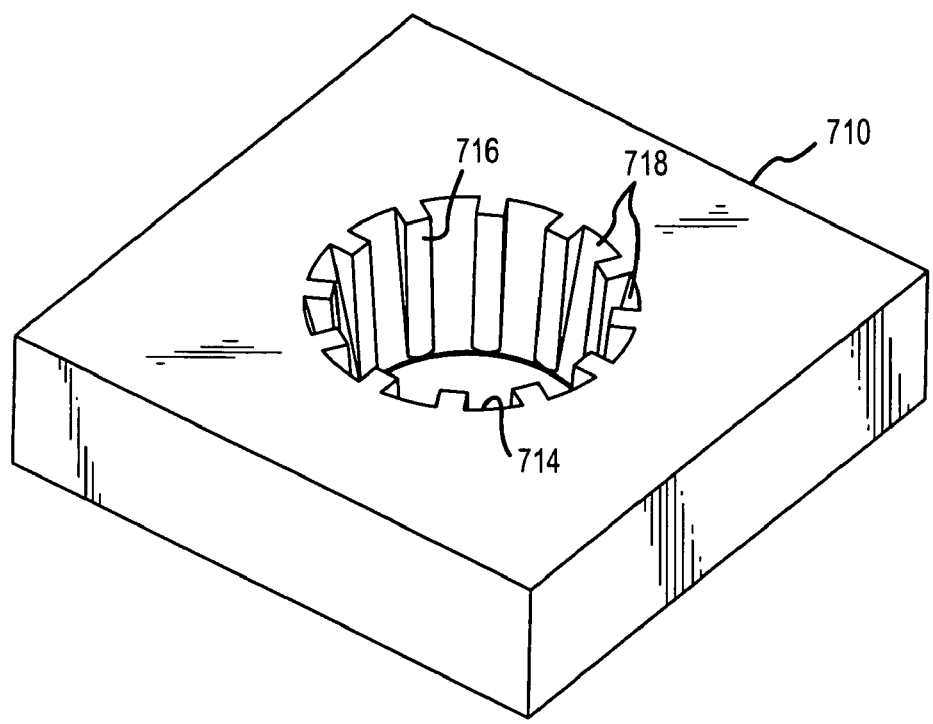
FIGS. 9 and 10 are a perspective and a top view, respectively, of the spreader plate or heat sink of the alternative power module assembly of FIGS. 7 and 8 showing in more detail the alternative configuration of a coolant opening or passageway in the plate or heat sink.
Figure 10:
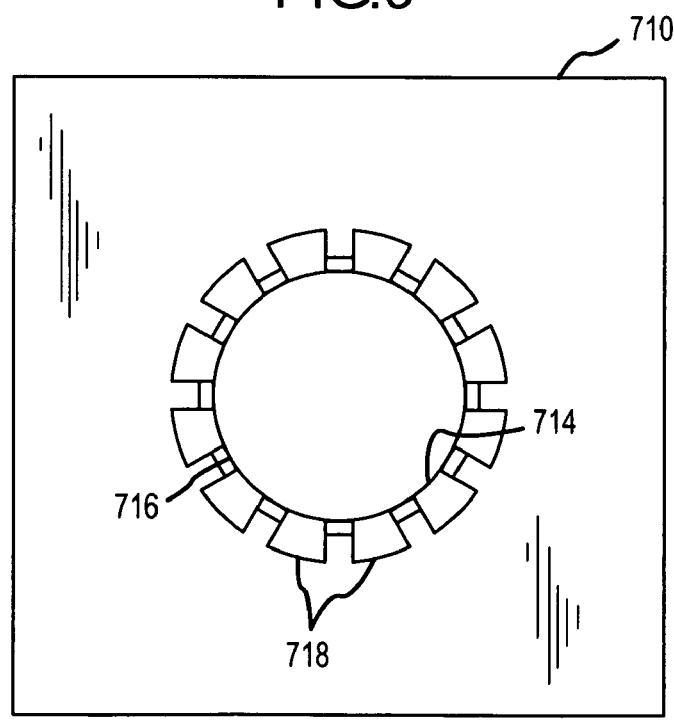

FIG. 6 illustrates a more detailed view of a portion of the power module assembly 400 including mating portions of the circuit substrate 420 and spreader plate 410 (i.e., the overlapping portion). The power module 430 is shown to include a circuit layer or die layer 436 that includes the circuit or electric component, such as an IGBT, and is often made up of an IC in a silicon die. The power module 430 further includes a bonding layer 432 for bonding the circuit layer 436 to the circuit substrate 420, and the bonding layer 432 in one embodiment of the invention is made up a solder material, as the circuit layer 436 is soldered to the circuit substrate. Here and elsewhere in this description the term "solder" is used in the general sense in the electronics industry and includes a range of readily meltable metals and alloys used to solder or bond one metal or metal element to another.

As discussed above, an important feature of the invention is that the circuit substrate 420 is sealably bonded to or mated with the upper surface 412 of the spreader plate or heat sink 410 such that coolant flowing along plate wall 416 cannot leak or seep through and contact the power module 430. In this regard, the circuit substrate 420 includes a bonding layer 422 made up of a nonporous material that rigidly bonds or mates the substrate 420 to the upper surface 412. In one embodiment, the substrate 420 is soldered to the upper surface 412, and in this case, the bonding layer 422 is made of solder or solder material that is mated to the upper surface 412 and to the adjacent layer of the substrate 420. The bonding layer 422 extends about the entire periphery of the opening 414 typically adjacent the wall 416 at the upper surface 412 so as to provide a continuous seal or dam against coolant in the opening 414. For example, as shown, the substrate 420 may be a DBC or similar substrate with two conductive layers 424, 428 (such as copper or the like) and a ceramic isolation layer 426, which may be made up of AlN or other ceramic materials. The upper copper or conductive layer 428 is in turn bonded to the power module 430 by the bonding layer 432 (e.g., layer of solder material). Note, FIGS. 5 and 6 are not drawn to scale to allow the bonding layers 422 and 432 to be more readily illustrated and these layers 422, 432 are typically much thinner than the other layers of the module 430 and substrate 420, with the specific thicknesses of the various layers of the power module assembly 400 not being limiting of the invention.

As shown, some of the heat generated from the power module 430 may pass through the substrate 420 to the plate 410. In this regard, the bonding layer 422 is preferably selected to have a relatively high thermal conductivity coefficient to enhance this heat transfer, e.g., is formed of a metal, metal alloy or the like such as a solder material. However, because a much larger amount of the generated heat is dissipated from the lower conductive or copper layer 424 directly to the coolant in the passageway 414, the use of a metal or other low thermal resistance material for the bonding layer 422 is not a required feature of the invention.

FIGS. 7–10 illustrate another embodiment of a power module assembly 700. As shown, the power module assembly 700 is similar to assembly 400 of FIGS. 4–6 in that it includes a spreader plate 710 that is sealably bonded to a circuit substrate 720 upon which a power module 730 is mounted. The power module 730 again includes a circuit or die layer 736 and a bonding layer 732, such as a solder layer, for mating the power module to the circuit substrate 720. The circuit substrate 720 includes a coolant-tight bonding layer 722 that sealably bonds the substrate 720 to the upper surface of the spreader plate 710. As shown, the substrate 720 includes an isolation layer 726 (e.g., a layer of ceramic or other electric isolator material) sandwiched between a lower conductor layer 724 and an upper conductor layer 728. The conductor layers 724, 728 may include a thickness of copper or other electric conductors, with the upper layer 728 mating with the bonding layer 732 of the power module 730. The lower conductor layer 724 mates with the bonding layer 722 and has a portion of its lower surface (i.e., a portion not mating with the bonding layer 722) exposed or open to the passageway 714 and any coolant therein. In this manner, coolant in the passageway 714 can directly exchange heat with substrate 720 through the lower conductor layer 724. Again, the size of the passageway 714 in the plate 710 is smaller at the upper surface of the plate 710 than the abutting substrate 720 to provide an overlapping or overhanging portion of the substrate 720 with a length, $L_O$, that provides adequate sealing surface and structural strength.

The power module assembly 700 differs from the power module assembly 400 in the configuration of its heat sink or spreader plate 710. The spreader plate 710 includes a coolant passageway or heat dissipation opening 714 that extends through the thickness of the plate 710 as does the opening 414 of plate 410 but with a modified wall surface to provide an enhanced heat transfer rate. As shown, the opening 714 includes a wall 716 that extends from the lower surface to the upper surface of the plate 710 at an angle such that the opening 714 is smaller at the upper surface (i.e., the surface of the plate 710 that abuts the circuit substrate 720) than at the lower surface. In the wall 716, a plurality of recessed surfaces 718 are provided so as to increase the heat transfer surface area of the wall 716 that contacts coolant within the passageway 714 and/or to increase heat transfer rates by causing a desired coolant flow pattern. The cross section of the recessed surfaces 718 may vary to practice the invention and may take the trapezoidal form shown or take another shape, such as triangular, semicircular, or the like, with the shape often being selected to support efficient manufacturing techniques.

Figure 11:
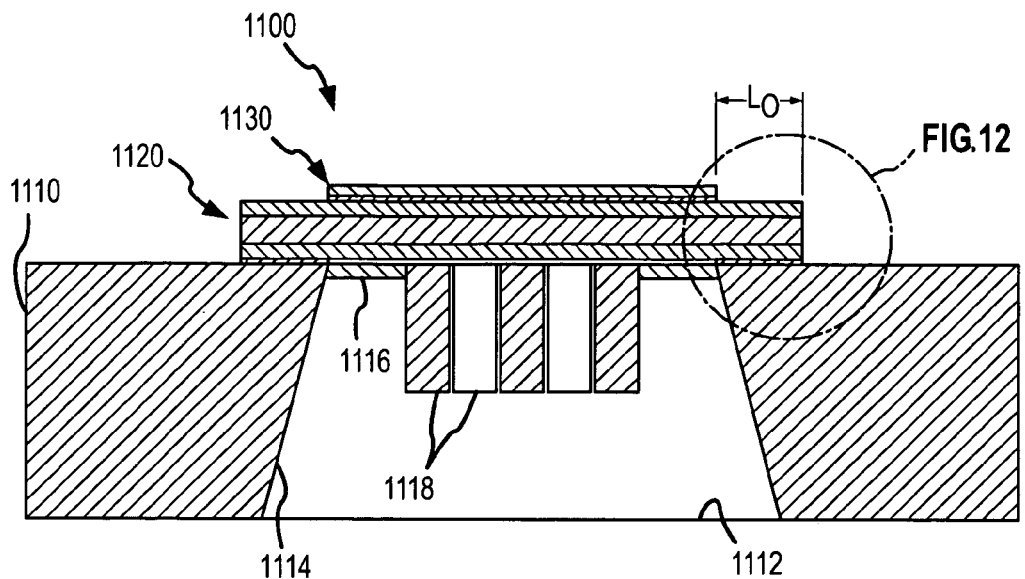
FIG. 11 is a cross sectional view similar to that of FIG. 5 of another alternative embodiment of a power module assembly according to the present invention.
Figure 12:
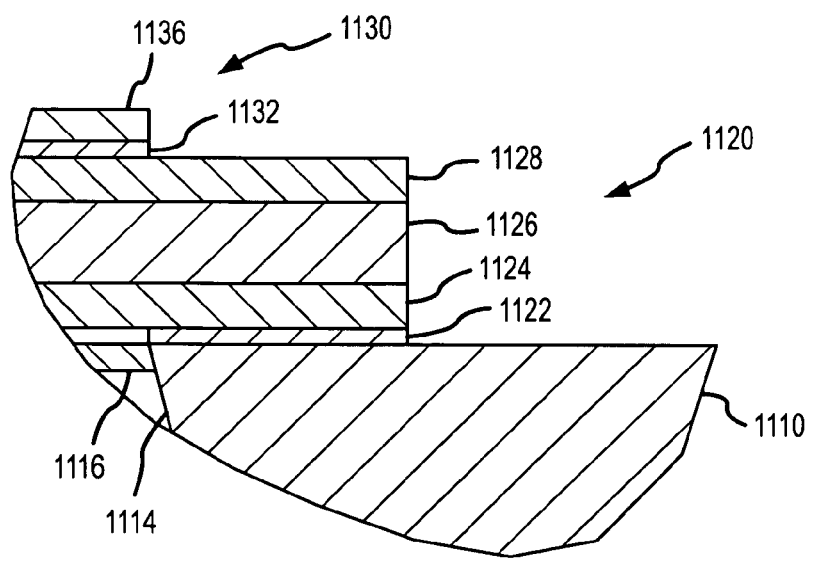
FIG. 12 is a detailed view of a portion of the power module assembly of FIG. 11 similar to that of FIG. 6.
Figure 13:
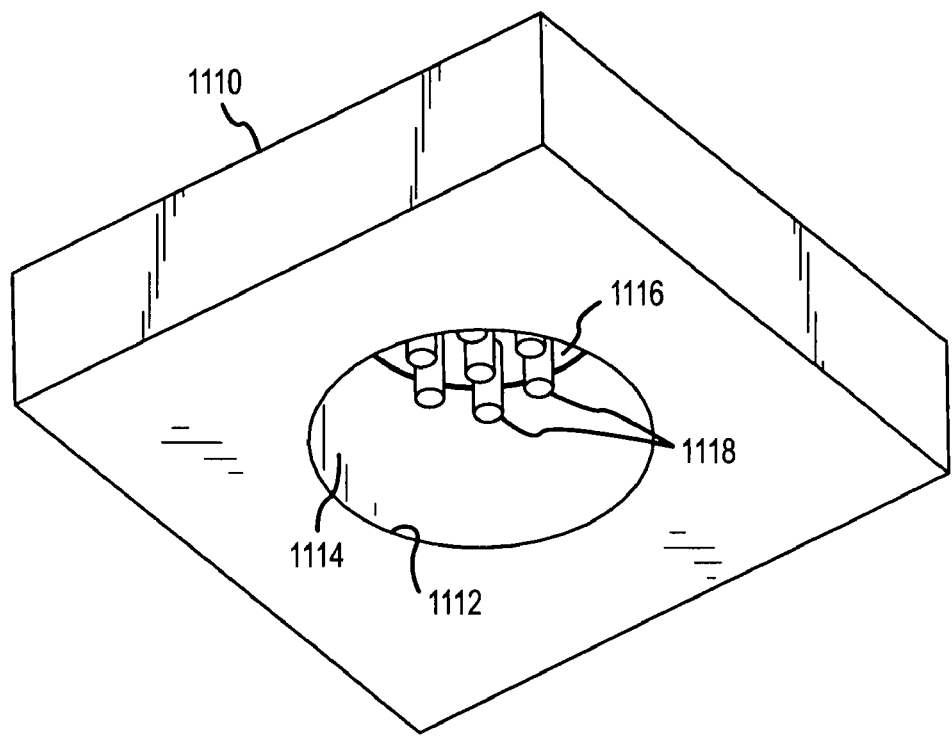
FIGS. 13 and 14 are a perspective view and a top view, respectively, of the spreader plate or heat sink of the assembly of FIG. 11 showing in more detail the provision of a heat transfer base in the coolant opening or passageway and heat transfer extensions, e.g., columns in the illustrated example.
Figure 14:
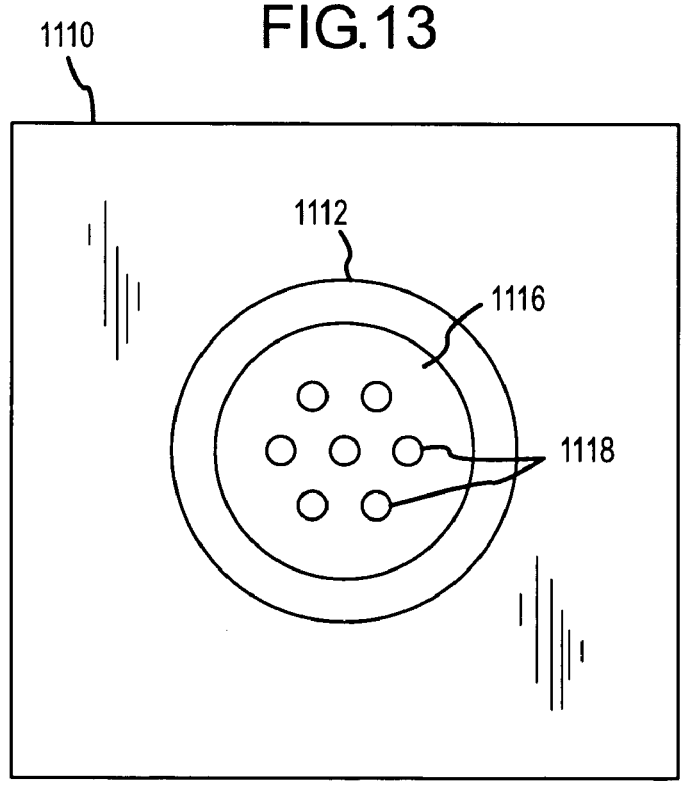

FIGS. 11–14 illustrate another power module assembly 1100 that provides low thermal resistance between a power module 1130 and coolant flowing adjacent a heat sink or spreader plate 1110. As shown in FIG. 11, the power module assembly 1100 includes a power module 1130, such as an IGBT, mounted upon a circuit substrate 1120, such as a DBC substrate, that is in turn mounted upon a spreader plate 1110. As with the other assemblies 400, 700, a passageway or opening 1112 is provided in the spreader plate 1110 to reduce thermal resistance by bringing coolant or a cooling medium into closer proximity to the power module 1130. In contrast to the other passageways, however, the passageway 1112 is shown to not extend completely through the thickness of the plate 1110 but instead extends substantially through the thickness of the plate 1110 to form a heat transfer plate or base 1116 that contacts the circuit substrate 1120.

More specifically, the power module 1130 includes a circuit or element layer 1136, such as a silicon die or IC chip, and a bonding layer 1132 to mate it with the circuit substrate 1120. The circuit substrate 1120 includes a pair of conductor layers 1128, 1124 sandwiching an electric isolation layer 1126, such as a layer of ceramic or other insulation material. A bonding layer 1122 is provided to mate the substrate 1120 with an upper surface of the plate 1110, and in some embodiments, the bonding layer 1122 is made up of solder material (but, of course, other materials may be used for the bonding layer 1122 to provide the desired bonding and sealing features) as the substrate 1120 is soldered to the upper surface of the plate 1110, which as with the other plates typically is formed from a metal suited for bonding by soldering in this example (if other bonding materials are used, the material used for plate 1110 may be selected to be compatible with that bonding material and bonding technique).

As shown, in FIGS. 11–14, the plate 1110 includes a passageway or opening 1112 with a wall 1114 configured similarly to wall 416 of assembly 400 in that it slopes inward from a lower to an upper surface of the plate 1110, whereby the opening 1112 is larger at the lower surface of the plate than the upper surface. As illustrated, a heat transfer base or plate 1116 is formed at the upper end of the passageway 1112. In other words, the passageway 1112 does not in this illustrated embodiment extend through the plate 1110 and coolant does not directly contact the substrate 1120. Upon the base 1116, a plurality of cooling rods or extensions 1118 are formed and extend outward from the base 1116 into the passageway 1112. In this embodiment, heat generated by the power module 1130 is conducted through the layers of the circuit substrate 1120 for dissipation to coolant in the passageway 1112 via portions of the plate 1110 and mainly through the base 1116 and rods/extensions 1118. The number, size, orientation, and spacing of the rods or extensions 1118 may vary to practice the invention with seven being shown for illustration purposes only.

In a variation of the assembly 1100 not shown, the base 1116 is removed or not provided with coolant being allowed to pass through the passageway or opening 1112 to contact the circuit substrate 1120 directly. In this variation, the bonding layer 1122 again acts as a seal between coolant in the passageway 1112 and the power module 1130 as coolant is allowed to directly contact the substrate 1120 (i.e., directly contact lower conductor layer 1124). In this embodiment, the cooling rods or extensions 1118 protrude or extend directly from the lower conductor layer 1124, and may be formed during the assembly of the substrate 1120 or formed separately and later bonded (e.g., soldered) to the layer 1124.

The above description and corresponding figures describe power module assemblies having a single power module (or electric circuit or electric component) that is configured with low thermal resistance according to the invention. It may now be useful to describe fabrication of a low thermal resistance electric circuit assembly that includes a plurality of electric circuit modules, which may include a variety of IC chips or the like such as power components, diodes, and the like. This manufacturing technique is suitable for producing chip set products such as power module assemblies with multiple IGBTs, diodes, and/or other IC chips or components, e.g., 2×9 (or other configuration) chip sets available from SEMIKRON or other electronics companies.

Figure 15:
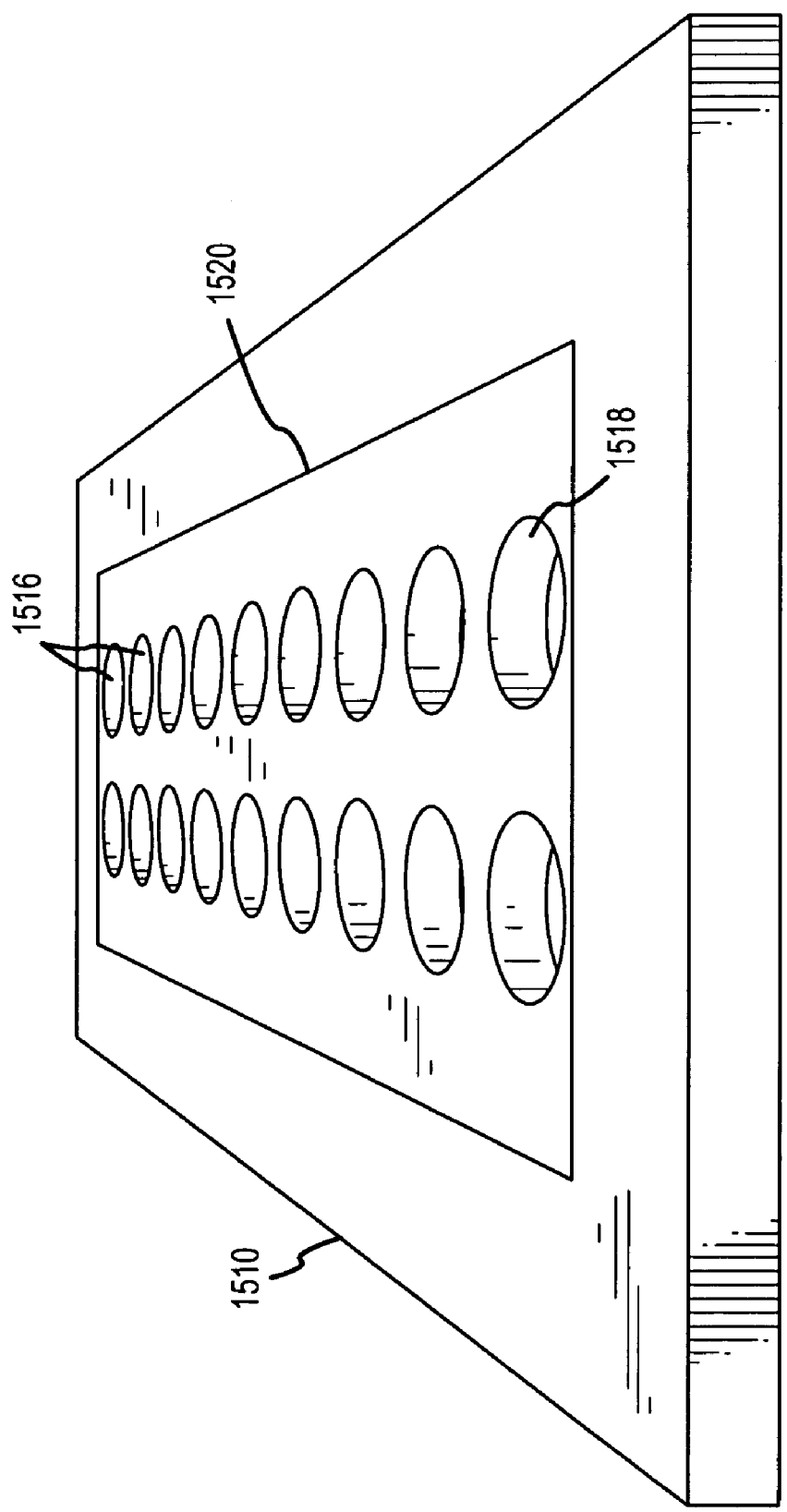
FIG. 15 illustrates a spreader plate or heat sink of a IGBT or power module assembly of the present invention configured for multiple power modules or circuit elements with multiple coolant passageways or openings and also showing an applied bonding and sealing layer, such as solder or other nonporous material.
Figure 16:
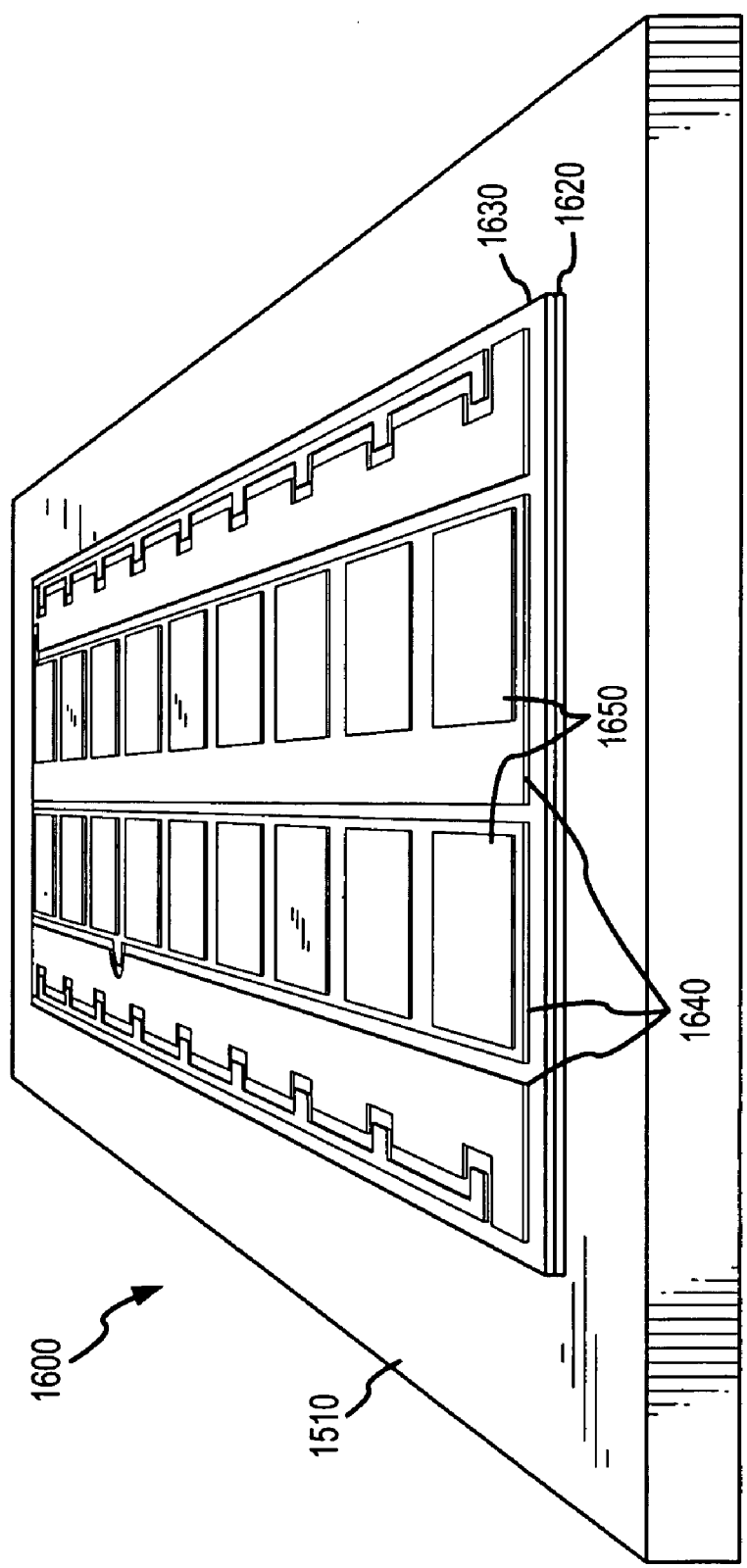
FIG. 16 illustrates the spreader plate of FIG. 16 after a circuit substrate such as a DBC has been mounted and after a number of power modules or other electric circuit components have been bonded to the circuit substrate proximal to the coolant passageways.

In this regard, FIGS. 15 and 16 illustrate the production of a 2×9 chip set assembly 1600 according to the present invention with low thermal resistance between electric modules (such as power modules, diodes, and the like) and a coolant (not shown). FIG. 15 illustrates a spreader plate (or heat sink) 1510, which is typically made of materials with high thermal conductivity such as a metal or metal alloy. The number of modules to be cooled is determined, and then, fabrication continues with punching or otherwise providing holes, openings, or passageways 1516 for each module to be cooled by the spreader plate 1510. As shown, eighteen holes or passageways 1516 with sidewalls 1518 are cut or punched through the entire thickness of the plate 1510.

The sidewalls 1518 are shown to be perpendicular to the top surface of the plate 1510 but in other embodiments the sidewalls 1518 may be sloped as shown in FIGS. 4–14 and at this point in production, heat transfer enhancing elements may also be provided, such as those shown in FIGS. 7–14. The positioning of the openings 1516 is selected to match the planned or mapped location of the electronic component modules or chips, e.g., with the center of each of the openings 1516 substantially aligning with a center of an overlying module or chip.

Because during use a coolant is allowed to flow through the passageways or openings 1516, the manufacturing method includes mating a circuit substrate with the spreader plate 1510 in a manner that not only provides bonding but provides a seal about the periphery of the openings 1516 that blocks the flow of the coolant. With this in mind, FIG. 15 illustrates that a layer of bonding and sealing material 1520 is applied to the spreader plate 1510. In one embodiment, the layer of bonding and sealing material 1520 is made up of a thin layer of soldering material that is applied to abut or be immediately adjacent the sidewalls 1518 of the openings 1516 (or to even cover a portion of the wall 1518). In some cases, the bonding and sealing layer 1520 is applied to the plate 1510 and then, the holes 1516 are cut or punched to ensure adequate coverage of the bonding and sealing material, e.g., soldering material or the like.

With the bonding layer 1520 in place, the other components of the assembly 1600 may be positioned and bonded to the plate 1510. In some embodiments, the other components/layers are produced as a single assembly and then, bonded (e.g., soldered) to the plate 1510. In other embodiments, one or more layers is applied separately. As shown, these other components include a circuit substrate or stack that includes a lower conductive layer 1620, an electric isolation layer 1630, and an upper conductive layer 1640. For example, the circuit substrate may be a DBC substrate and, in these embodiments, the lower conductive layer 1620 and the upper conductive layer 1640 are made up of a thickness of copper and the upper conductive layer 1640 is provided with a desired pattern to support circuit functionalities and mate with electric component modules or chips 1650. In the DBC substrate embodiment, the isolation layer 1630 may be AlN or another useful ceramic material.

As shown, a plurality of electric component modules or chips 1650 are applied over the top layer of the circuit substrate 1640. As discussed previously, the modules 1650 may include a silicon die or element layer that is soldered or otherwise bound to the upper conductive layer 1640. The modules 1650 are positioned such that the openings 1516 are adjacent or directly beneath the modules 1650 such that during operation, heat generated by the modules 1650 is at least partially dissipated through the circuit substrate layers 1650, 1640, 1630 to a coolant in the opening 1516. In a typical manufacturing process, the spreader plate 1510 is prepared as shown in FIG. 15 and then, the circuit substrate with layers 1620, 1630, and 1640 and modules 1650 (which were assembled in a separate step(s)) are positioned on the plate 1510 with the lower conductive layer 1620 contacting the bonding and sealing layer 1520. If soldering is utilized, the layer 1520 is heated and allowed to cool to effect bonding between the upper surface of the plate 1510 and the lower conductive layer 1620 of the circuit substrate. In this bonding step, a seal is also created between the plate 1510 and the lower conductive layer 1620.

The assembly 1600 was modeled to determine the exemplary effectiveness of the low thermal resistance design. In the model, the modules 1650 were assumed to be IGBT's in a silicon die that were 10 mm by 10 mm, designed to operate below 125° C., and had a 90 W/cm² heat flux. Coolant or cooling medium that flowed over the lower surface of the heat sink or spreader plate 1510 (and into openings 1516) was assumed to have an inlet temperature of 90° C. The spreader plate 1510 was assumed to be a metal with a thickness of 3 to 6 mm. The electric substrate was a DBC substrate with an AlN layer sandwiched between two copper layers. The two bonding layers were assumed to be made up of a solder material, and specifically, 90Pb—10Sn solder. A uniform heat transfer coefficient of 50,000 W/m² K was used on the heat sink side. In addition to the inventive configuration, a conventional configuration with a solid spreader plate and a bonding material of thermal grease was modeled as was a configuration with a solid spreader plate and a bonding material of solder material.

A portion of the modeling results are illustrated in the bar graph 1700 of FIG. 17. The graph 1700 shows the temperature difference between the coolant and the power module during operation of the various configurations. As will be appreciated, it is highly desirable to reduce the temperature difference or rise in coolant required to maintain the power or other modules at desired operating temperatures. As shown by bar 1710, the modeled temperature difference for a conventional solid plate with thermal grease bonding material was 60° C. A large improvement was achieved in a configuration using solder material for the bonding material which is shown by bar 1720 to result in a temperature rise or difference of about 34° C.

An even larger or significant improvement is achieved when a spreader plate with heat coolant passageways are utilized. Bar 1730 shows the results of modeling a tapered passageway design with a lower diameter of 10 mm and an upper diameter of 7 mm (e.g., adjacent the circuit substrate). As can be seen, the temperature difference has been reduced to about 24° C. or less than 50 percent of the difference of a conventional configuration. If the opening dimensions are increased to a lower diameter of 12 mm and an upper diameter of 9 mm, the temperature difference is even further reduced to about 21° C. as shown by bar 1740.

The effectiveness of the low thermal resistance embodiments of the invention are verified with this modeling, and it should be readily apparent that power module assemblies can be produced with thermal resistance between the silicon die (or power module) and the heat sink being reduced by up to 50 percent or more. Stress distribution modeling was also performed, and it was determined that passageways or openings through the spreader plate or heat sink can be utilized while maintaining the stress and deflection levels within acceptable ranges for power module assemblies such as standard operating requirements for IGBT stacks (although, of course, the maximum size of such passageways (or amount of overlap length, $L_O$) should be selected to suit the particular materials, layer thicknesses, and other design parameters). Additional details from the modeling are provided in the following table.

| Cooling Plate | Solid | Solid | With openings of 7 mm upper diam and 9 mm lower diam | With openings of 9 mm upper diam and 12 mm lower diam |
|---|---|---|---|---|
| Substrate Bonding Material | Thermal Grease | Solder | Solder | Solder |
| Max. Temp. of Power Module | 149.9° C. | 124.3° C. | 114.5° C. | 111.4° C. |
| Coolant Temperature | 90° C. | 90° C. | 90° C. | 90° C. |

It a maximum operating temperature of the power module is assumed to be 125° C., it can be seen by the values of the model provided in the above table that the use of coolant passageways or openings is useful for maintaining the modules well below this temperature.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed. For example, the above examples show a planar heat sink provided in the form of a spreader plate, but a heat sink with fins, tabs, channels, and the like may be used in combination with the heat coolant passageways or openings of the invention. To further illustrate how the inventive concepts can be expanded, the plate 1510 of FIG. 15 may be modified to combine 2 or more of the coolant passageways. For example, the 18 passageways may be replaced with 2 passageways having an oval, elliptical, rectangular, or other shaped cross section, and these 2 passageways would extend substantially from one end to the other of the plate 1510 (e.g., the material between the illustrated passageways could be removed).

We claim:

1. A power module assembly with low thermal resistance, comprising:

a heat sink plate with a lower surface and an upper surface, the heat sink plate comprising a plurality of passageways for coolant extending from the lower surface to the upper surface;

a circuit substrate positioned on the heat sink plate covering the coolant passageways, wherein the circuit substrate comprises a bonding layer extending about the periphery of each of the coolant passageways and comprising a material nonporous to the coolant; and a set of power modules mounted on the circuit substrate opposite the bonding layer, each of the power modules being positioned on the circuit substrate over only one of the coolant passageways, wherein coolant flowing separately into each of the coolant passageways of the heat sink plate directly contacts the circuit substrate in an area opposite and proximate to each one of the power modules.

2. The assembly of claim 1, wherein the bonding layer comprises a material with high thermal conductivity bonded to the upper surface of the heat sink plate.

3. The assembly of claim 2, wherein the bonding layer material comprises solder material.

4. The assembly of claim 1, wherein each of the coolant passageways has a circular cross section with a sidewall extending from the lower surface to the upper surface of the heat sink plate.

5. The assembly of claim 4, wherein the sidewalls slope inward from the lower surface such that each of the coolant passageways has a diameter at the lower surface that is greater than a diameter at the upper surface of the heat sink plate.

6. The assembly of claim 1, wherein the power modules each comprise an insulated gate bipolar transistor (IGBT) module and the circuit substrate further comprises a direct bonded copper (DBC) substrate bonded to the bonding layer and to the IGBT module, the DBC substrate comprising a pair of layers of copper sandwiching a ceramic isolation layer.

7. An electronic assembly with low thermal resistance, comprising:
a metallic spreader plate with a lower surface and an upper surface and a heat dissipation opening extending through the plate from the upper surface to the lower surface;
a circuit substrate;
a bonding and sealing layer disposed between the circuit substrate and the plate and bonding the circuit substrate to the upper surface of the plate; and
an electric component layer positioned on the circuit substrate distal to the plate comprising an integrated circuit (IC) generating heat during operation, the heat dissipating at least in part through the circuit substrate to a cooling medium in the heat dissipation opening, wherein the bonding and sealing layer blocks flow of the cooling medium between the circuit substrate and the plate;
wherein the heat dissipation opening has a circular cross section with a diameter at the upper surface that is lower than a diameter at the lower surface; and
wherein the heat dissipation opening comprises a side wall with a plurality of channels extending from the lower surface to the upper surface of the plate.

8. The assembly of claim 7, wherein the bonding and sealing layer is positioned about the periphery of the heat dissipation opening, whereby the cooling medium in the heat dissipation opening contacts the circuit substrate.

9. The assembly of claim 8, wherein the bonding and sealing layer comprises a nonporous solder material.

10. The assembly of claim 7, wherein the circuit substrate further comprises a plurality of cooling rods positioned within the heat dissipation opening and contacting and extending away from an electrical conductor layer of the circuit substrate.

11. The assembly of claim 7, wherein the IC comprises an insulated gate bipolar transistor (IGBT) and the electronic component layer further comprises a silicon die and wherein the circuit substrate comprises a ceramic isolation layer between an upper and a lower layer of electrically conductive material, the lower layer being sealably bonded to the bonding and sealing layer and being at least partially exposed to the cooling medium in the heat dissipation opening.

12. A method of manufacturing a power module assembly with low thermal resistance, comprising:
providing a power module substrate comprising a plurality of power modules distributed in a pattern on a circuit substrate, the circuit substrate comprising a pair of electrical conductor layers with a ceramic isolation layer there between;
providing a metallic plate having a thickness;
based on the power module pattern, making a hole through the thickness of the plate for each of the power modules, wherein one of the holes is provided to extend through the plate to a particular one of the power modules to provide a path for coolant flowing on a first side of the plate flow to each of the power modules through the plate thickness;
applying a bonding material to an upper surface of the plate, wherein the bonding material is applied continuously about the periphery of each of the holes in the plate; and
bonding the plate to the power module substrate, wherein the holes in the plate are substantially aligned with the power modules with a central axis of the holes substantially aligned with a center of one of the power modules and wherein one of the electrical conductor layers mates with the bonding material.

13. The method of claim 12, wherein the bonding material comprises solder and the bonding comprises soldering the plate to the one of the electrical conductor layers with the solder.

14. The method of claim 12, wherein bonding material is substantially nonporous to liquids and after the bonding, the bonding material forms a liquid-tight seal between the upper surface of the plate and the mating one of the electrical conductor layers.

15. The method of claim 12, wherein the making comprises punching the holes in the plate.

16. The method of claim 12, wherein the holes are tapered with a diameter that increases with distance from the circuit substrate.

17. The method of claim 12, wherein the power modules each comprise an insulated gate bipolar transistor (IGBT) in a silicon die and wherein the circuit substrate comprises a direct bonded copper (DBC) substrate.

18. The method of claim 12, wherein the providing of the power module substrate comprises providing the silicon dies with the IGBTs and the DBC substrate and then, bonding the silicon dies to the second one of the electrical conductor layers in the power module pattern.

19. A method of manufacturing an electronic assembly with low thermal resistance, comprising:
providing a plurality of heat-generating electronic components distributed in a pattern on a circuit substrate, the circuit substrate comprising a pair of electrical conductor layers with an isolation layer there between;
providing a metallic plate having a thickness;
based on the power module pattern, making a hole through the thickness of the plate for each of the electronic components, wherein the holes are tapered to increase in size with distance from the circuit substrate; and
bonding the plate to the circuit substrate, wherein the holes in the plate are substantially aligned with the electronic components with a central axis of the holes substantially aligned with a center of one of the electronic components.

20. A power module assembly with low thermal resistance, comprising:

a heat sink plate with a lower surface and an upper surface, the heat sink plate comprising a plurality of passageways for coolant extending from the lower surface to the upper surface;

a circuit substrate positioned on the heat sink plate covering the coolant passageways, wherein the circuit substrate comprises a bonding layer extending about the periphery of each of the coolant passageways and comprising a material nonporous to the coolant; and a set of power modules mounted on the circuit substrate opposite the bonding layer, each of the power modules being positioned on the circuit substrate proximal to one of the coolant passageways;

wherein each of the coolant passageways has a circular cross section with a sidewall extending from the lower surface to the upper surface of the heat sink plate and wherein the sidewalls slope inward from the lower surface such that each of the coolant passageways has a diameter at the lower surface that is greater than a diameter at the upper surface of the heat sink plate.

* * * * *